(12) United States Patent
Young et al.

(10) Patent No.: US 8,294,516 B2
(45) Date of Patent: Oct. 23, 2012

(54) POWER AMPLIFIER PRE-DISTORTION

(75) Inventors: Christopher Young, Cupertino, CA (US); Elias Simpson, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 153 days.

(21) Appl. No.: 12/139,634

(22) Filed: Jun. 16, 2008

(65) Prior Publication Data

US 2008/0309405 A1 Dec. 18, 2008

Related U.S. Application Data

(60) Provisional application No. 60/929,150, filed on Jun. 15, 2007.

(51) Int. Cl.
*H03F 1/26* (2006.01)
(52) U.S. Cl. ........................ 330/149; 375/297
(58) Field of Classification Search .................. 330/149, 330/151; 375/297; 455/114.3
See application file for complete search history.

(56) References Cited

U.S. PATENT DOCUMENTS

| | | | |
|---|---|---|---|
| 5,454,010 A * | 9/1995 | Leveque | 375/136 |
| 5,477,504 A * | 12/1995 | Hagerty | 367/13 |
| 6,587,513 B1 * | 7/2003 | Ichihara | 375/296 |
| 6,831,584 B2 | 12/2004 | Jiang et al. | |
| 6,972,629 B2 | 12/2005 | Behzad | |
| 6,995,616 B2 | 2/2006 | Behzad et al. | |
| 6,998,921 B2 | 2/2006 | Behzad | |
| 7,027,780 B2 | 4/2006 | Jensen | |
| 7,035,345 B2 * | 4/2006 | Jeckeln et al. | 375/296 |
| 7,071,785 B2 | 7/2006 | Behzad | |
| 7,138,876 B2 | 11/2006 | Behzad | |
| 7,164,321 B2 | 1/2007 | Behzad | |
| 7,177,374 B2 | 2/2007 | Gaikwad et al. | |
| 7,183,847 B2 * | 2/2007 | Suzuki et al. | 330/149 |
| 7,187,916 B2 | 3/2007 | Mo et al. | |
| 7,199,670 B2 | 4/2007 | Behzad | |
| 7,203,227 B1 | 4/2007 | Currivan et al. | |
| 7,233,773 B2 | 6/2007 | Hansen et al. | |
| 7,259,630 B2 * | 8/2007 | Bachman et al. | 330/297 |
| 7,269,430 B2 | 9/2007 | Moorti et al. | |
| 7,279,972 B2 * | 10/2007 | Smithson | 330/149 |
| 7,321,264 B2 * | 1/2008 | Kokkeler | 330/149 |
| 7,340,265 B2 * | 3/2008 | Husted et al. | 455/501 |
| 7,362,251 B2 | 4/2008 | Jensen et al. | |
| 7,394,862 B2 | 7/2008 | Jensen et al. | |
| 7,397,863 B2 | 7/2008 | Jensen | |
| 7,403,573 B2 * | 7/2008 | DeBruyn et al. | 375/297 |
| 7,414,470 B2 * | 8/2008 | Okazaki | 330/149 |

(Continued)

OTHER PUBLICATIONS

Intensi-fi Product Brief: Draft-802.11n Product Family, Broadcom Corporation Intensi-fi-PB03-R, Jun. 27, 2008, 2 pages.

*Primary Examiner* — Henry Choe
(74) *Attorney, Agent, or Firm* — Sterne, Kessler, Goldstein & Fox P.L.L.C.

(57) ABSTRACT

The present invention is directed to systems and methods for reducing the distortion of power amplifiers. In particular, methods and systems are described that enable a determination of a pre-distortion correction signal to be determined, which when added to the nominal signal, a reduction in the distortion of the power amplifier results. In addition, methods and systems are described that enable calibration of individual power amplifiers to be accomplished for use with the above described approach. More specifically, the methods and systems are described for use in a MIMO application. These approaches may be applied to on-chip power amplifiers, off-chip power amplifiers, or any combination thereof.

21 Claims, 8 Drawing Sheets

U.S. PATENT DOCUMENTS

| | | | | |
|---|---|---|---|---|
| 7,421,254 | B2 | 9/2008 | Behzad | |
| 7,463,864 | B2 | 12/2008 | Vassiliou et al. | |
| 7,483,802 | B2 * | 1/2009 | Wood | 702/86 |
| 7,492,223 | B2 | 2/2009 | Behzad et al. | |
| 7,509,102 | B2 | 3/2009 | Rofougaran et al. | |
| 7,515,652 | B2 | 4/2009 | Jensen | |
| 7,522,658 | B2 | 4/2009 | Jensen | |
| 7,538,610 | B2 | 5/2009 | Magoon et al. | |
| 7,570,187 | B2 | 8/2009 | Jensen | |
| 7,577,413 | B2 * | 8/2009 | He et al. | 455/226.1 |
| 7,596,363 | B2 | 9/2009 | Mo et al. | |
| 7,616,929 | B2 | 11/2009 | Behzad | |
| 7,620,373 | B2 * | 11/2009 | Cole et al. | 455/73 |
| 7,646,876 | B2 * | 1/2010 | Chu et al. | 381/92 |
| 7,679,449 | B2 | 3/2010 | Behzad et al. | |
| 7,715,836 | B2 | 5/2010 | Vassiliou et al. | |
| 7,729,671 | B2 | 6/2010 | Afsahi et al. | |
| 7,746,956 | B2 | 6/2010 | Plevridis | |
| 7,818,028 | B2 | 10/2010 | Vassiliou et al. | |
| 7,831,227 | B2 | 11/2010 | Rofougaran et al. | |
| 7,840,198 | B2 | 11/2010 | Behzad et al. | |
| 7,860,188 | B2 | 12/2010 | Jensen | |
| 7,868,696 | B2 | 1/2011 | Behzad et al. | |
| 7,869,541 | B2 | 1/2011 | Frantzeskakis et al. | |
| 7,873,325 | B2 | 1/2011 | Behzad | |
| 7,881,402 | B2 * | 2/2011 | Gao et al. | 375/296 |
| 7,894,780 | B2 | 2/2011 | Pan et al. | |
| 7,941,107 | B2 | 5/2011 | Behzad | |
| 7,944,376 | B2 | 5/2011 | Jensen | |
| 8,010,076 | B2 | 8/2011 | Mo et al. | |
| 8,027,376 | B2 | 9/2011 | Yamanaka et al. | |
| 8,041,306 | B2 | 10/2011 | Behzad | |
| 8,068,793 | B2 | 11/2011 | Afashi et al. | |
| 2004/0041721 | A1 | 3/2004 | Jiang et al. | |
| 2006/0198477 | A1 | 9/2006 | Moorti et al. | |
| 2006/0223483 | A1 | 10/2006 | Behzad | |
| 2006/0285478 | A1 | 12/2006 | Gaikwad et al. | |
| 2007/0002878 | A1 | 1/2007 | Moorti et al. | |
| 2007/0002981 | A1 | 1/2007 | Gaikwad et al. | |
| 2007/0019749 | A1 | 1/2007 | Gaikwad et al. | |
| 2007/0019750 | A1 | 1/2007 | Gaikwad et al. | |
| 2007/0030077 | A1 | 2/2007 | Behzad | |
| 2007/0110197 | A1 | 5/2007 | Bagchi et al. | |
| 2007/0275676 | A1 | 11/2007 | Rofougaran et al. | |
| 2008/0101495 | A1 | 5/2008 | Gaikwad | |
| 2008/0101496 | A1 | 5/2008 | Gaikwad | |
| 2008/0101497 | A1 | 5/2008 | Gaikwad et al. | |
| 2008/0139156 | A1 | 6/2008 | Behzad et al. | |
| 2008/0310336 | A1 | 12/2008 | Gaikwad | |
| 2008/0310487 | A1 | 12/2008 | Hammerschmidt | |
| 2008/0310557 | A1 | 12/2008 | Gaikwad | |
| 2008/0310558 | A1 | 12/2008 | Gaikwad | |
| 2008/0310559 | A1 | 12/2008 | Gaikwad | |
| 2009/0033425 | A1 | 2/2009 | Behzad et al. | |
| 2009/0124219 | A1 | 5/2009 | Behzad | |
| 2009/0154598 | A1 | 6/2009 | Jensen | |
| 2009/0163156 | A1 | 6/2009 | Rofougaran et al. | |
| 2009/0289826 | A1 | 11/2009 | Jensen | |
| 2010/0016004 | A1 | 1/2010 | Behzad | |
| 2011/0105052 | A1 | 5/2011 | Behzad | |

* cited by examiner

POWER AMPLIFIER PRE-DISTORTION

CROSS REFERENCE TO RELATED APPLICATIONS

The present application claims the benefit of U.S. Provisional Patent Application No. 60/929,150, entitled "Power Amplifier Pre-Distortion", filed on Jun. 15, 2007, which is hereby expressly incorporated by reference in its entirety.

BACKGROUND OF THE INVENTION

1. Field of the Invention

The present invention relates generally to power amplifiers, and more specifically to the pre-distortion of power amplifiers.

2. Related Art

A critical component of any communications system is the power amplifier in the transmitter. The function of the power amplifier is to amplify an input data signal and thereby create a high powered version of that input data signal for subsequent output into a transmission channel. The greater the amplification capability of the power amplifier, the greater the resulting output power level, and therefore the larger the geographic area covered by the communications system. In addition to the increased coverage area, an increased output power level typically results in increased efficiency (as measured by the ratio of resulting output power to input direct current (DC) power to the power amplifier).

However, concurrent with these improvements in link coverage and power amplifier efficiency, the distortion in the output data signal unfortunately increases with increasing power level. Such distortion reveals itself in many ways, including as a spillover of transmitted power into frequencies outside the intended frequency band of transmission. It also reveals itself as a degradation of the quality of the in-band signal such that larger constellations and higher throughput rates are inhibited at higher transmission powers. Such distortion, a result of the nonlinearities in the power amplifier, directly diminishes the useful output power range of the power amplifier. It is therefore desirable to minimize the distortion and to thereby capitalize on as much of the available output power from the power amplifier as possible.

Traditionally, the final stage of power amplification in a communications transmission system has been performed "off-chip" in order to simultaneously achieve the two goals of having sufficient output power and low distortion. Such off-chip power amplifiers are expensive. Moreover, they do not provide the same integration opportunities afforded by an on-chip amplifier, such as optimization of associated power amplifier (PA) circuitry, integration of the power supplies, consistency of PAs (from one to the next), ease of testing and calibration, and reliable connectivity. It is therefore highly desirable to minimize the distortion of power amplifiers in general, and in particular on-chip power amplifiers, so that benefits of integration can be realized while still providing the required high level of output power.

The advent of multiple-input multiple-output (MIMO) communications system architectures has intensified the challenges described above. A MIMO approach exploits the spatial diversity implicit in having multiple transmitters communicating the same data signal to multiple receivers. By spatially propagating more than one version of the same data signal, improvements in communications coverage and link quality readily materialize over that routinely available from the traditional single-input single-output approach.

To fully capture these MIMO benefits, a premium is therefore placed on the ability to readily fabricate a multiplicity of low distortion power amplifiers, with uniform performance characteristics, at low cost, and in a form that can be readily integrated with the rest of the transmitter functionality. While many of these benefits can be realized using off-chip power amplifiers, the full potential of benefits comes into fruition through the use of low distortion on-chip power amplifiers.

What is needed, therefore, is an approach that solves one or more of these power amplifier challenges in a modern data communications system, namely increased output power, reduced distortion, greater ease of integration with the associated circuitry in the transmitter chain, and lower cost. With respect to a MIMO transmitter application, it is highly desirable that an approach be found that addresses not only the above challenges, but also the uniformity of the performance characteristics of a multiplicity of power amplifiers.

SUMMARY OF THE INVENTION

The present invention is directed to a power amplifier pre-distortion technique that reduces the distortion of a power amplifier by pre-distorting the input signal to that power amplifier. The amount of pre-distortion is determined to be that amount which offsets the distortion that is generated internally by the nonlinearities within the power amplifier. A calibration procedure uses a set of tones over the nonlinear operating range of the power amplifier to determine the level of offset required. Such offsets are stored in a look-up table that can be read in real-time, such that the appropriate level of pre-distortion can be added to the input signal to the power amplifier.

In yet another embodiment of this invention, in a MIMO system containing a multiplicity of power amplifiers, each power amplifier is provided with a look-up table for real-time pre-distortion of the input signal to each power amplifier. Different calibration approaches are described that address the varying coupling that may be present between the multiplicity of power amplifiers when they are in an active state.

Further embodiments, features, and advantages of the present invention, as well as the structure and operation of the various embodiments of the present invention are described in detail below with reference to accompanying drawings.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1:
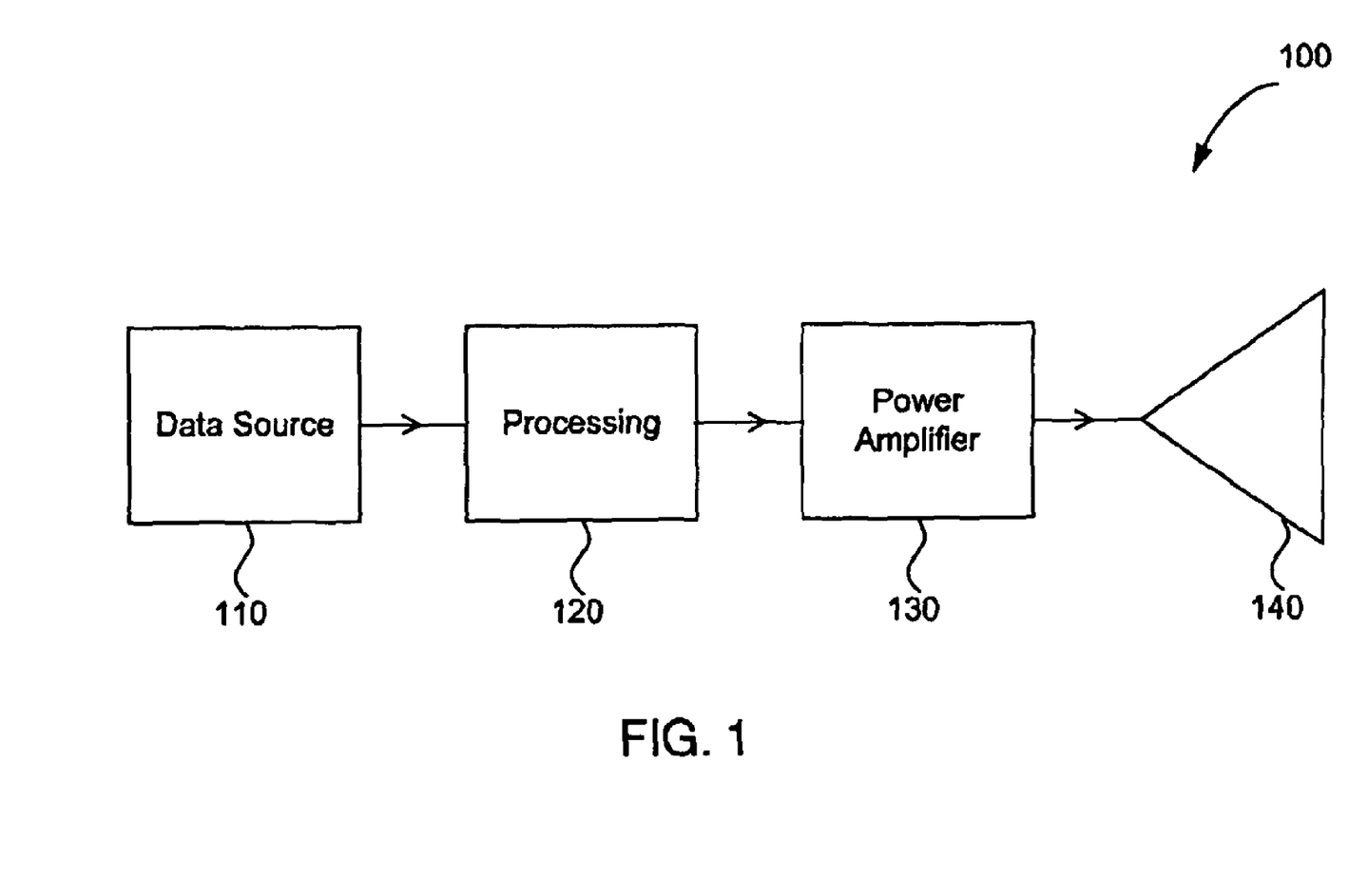
FIG. 1 is a block diagram that illustrates different components in a transmitter of a conventional analog communications system.

FIG. 1 illustrates typical functionality in a data communications transmitter 100. A data source 110 outputs data that is subsequently fed into a processing module 120. Functionality included within the processing module 120 potentially includes modulation, encoding, filtering, frequency up-conversion, and pre-amplification. Output from the processing module 120 is then fed into a conventional power amplifier 130, which amplifies the input signal to produce an output signal that is coupled to an antenna 140. The power amplifier 130 can be an on-chip power amplifier, an off-chip power amplifier, or a cascaded combination of on-chip and off-chip power amplifiers.

Figure 2:
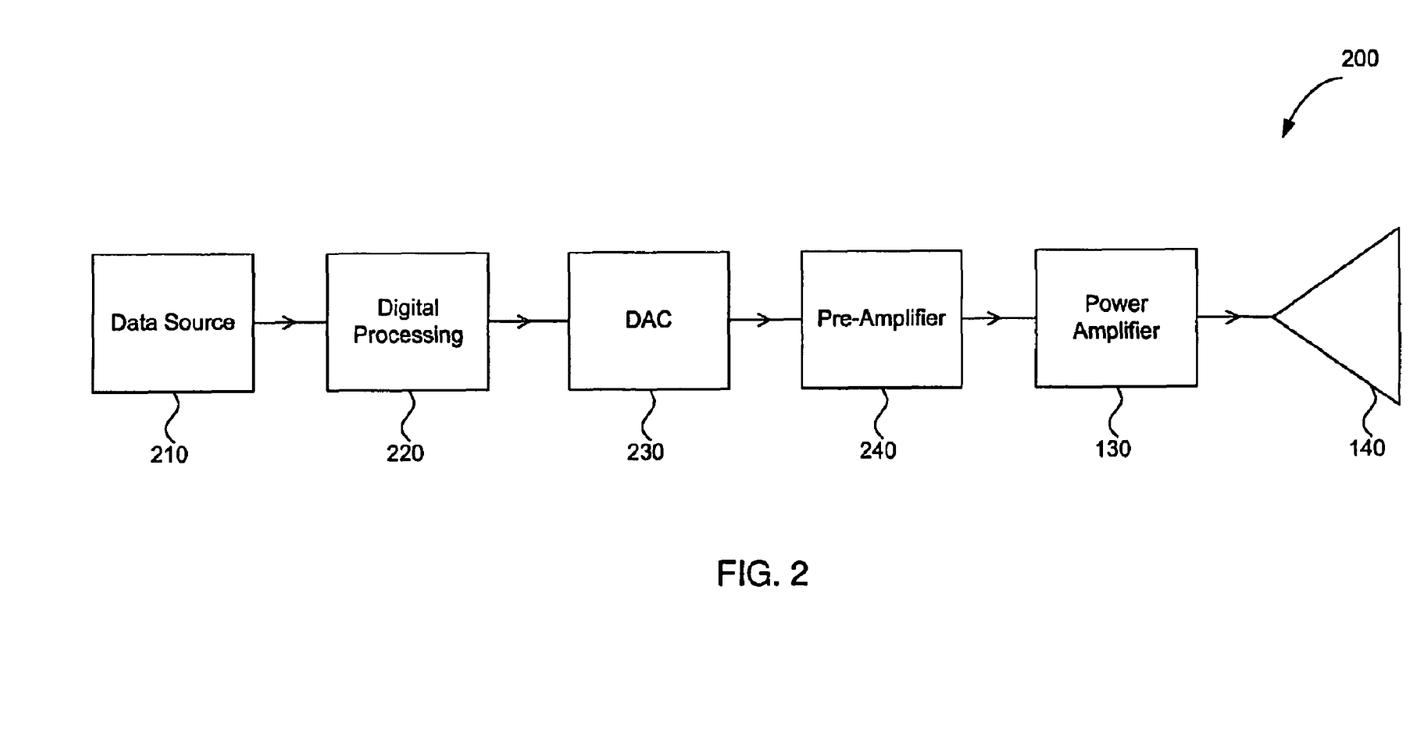
FIG. 2 is a block diagram that illustrates the different components in a transmitter of a conventional digital communications system.

FIG. 2 illustrates a digital implementation 200 of a data communications transmitter, wherein a digital data source 210 is fed into a digital processing module 220, whose output is fed into a digital-to-analog converter (DAC) 230. Functionality included within the digital processing module 220 potentially includes digital modulation, digital encoding, digital filtering, digital frequency up-conversion, and digital pre-amplification. The output of the DAC 230 is then fed into a pre-amplifier module 240, whose output is fed into the power amplifier 130 where the signal is amplified before input to the antenna 140, as before. Functionality included within the pre-amplifier module 240 potentially includes filtering, frequency up-conversion, and pre-amplification.

Figure 3A:
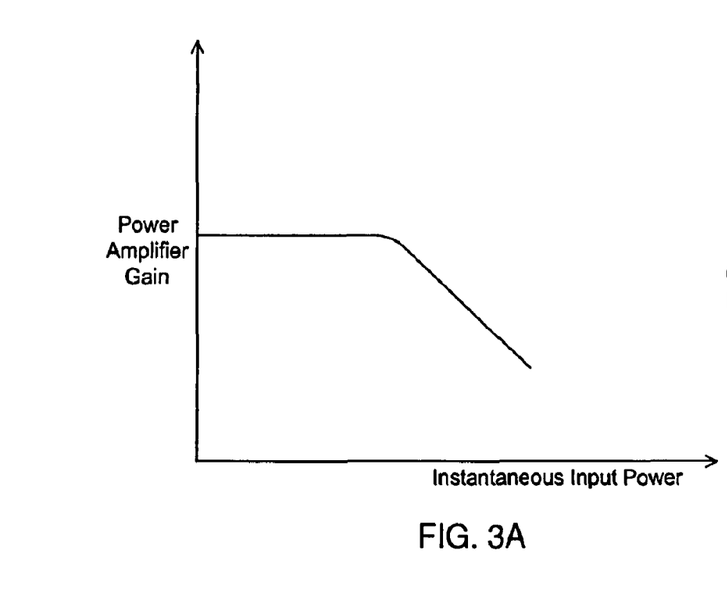
FIG. 3A illustrates an exemplary amplitude response of a power amplifier in one of the systems shown in FIG. 1 or 2.

FIG. 3 illustrates nonlinear effects of the power amplifier 130. FIG. 3A shows a typical response of a power amplifier 130 as a function of increasing input power. If the power amplifier 130 was ideal, it would provide an output power level that is directly proportional to the input power level, and therefore the plotted response of gain versus input power would be a horizontal line. The power amplifier 130, however, is not ideal and therefore includes non-linearities. As FIG. 3A indicates, nonlinear effects result in the power amplifier 130 going into compression at the higher input power levels. The nonlinear effects are characterized as amplitude modulation (AM) to amplitude modulation (AM) distortion.

Figure 3B:
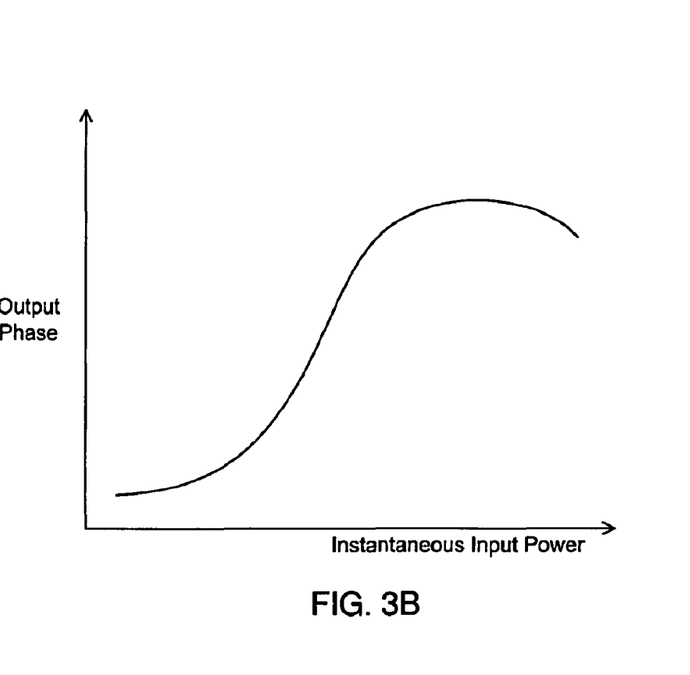
FIG. 3B illustrates an exemplary phase response of a power amplifier, such as the amplifier shown in FIG. 3A.

Similarly, FIG. 3B shows a typical response of the power amplifier 130 wherein phase is plotted against increasing input power. Again, if the power amplifier 130 was ideal, there would be a constant phase difference between input and output signals, as the input power varies over its operating range. However, the inherent nonlinearities in the power amplifier 130 result in phase shift variation in response to input power variation. This nonlinear effect is characterized as AM to phase modulation (PM) distortion.

The power amplifier 130 exhibits both types of distortion, namely both AM to AM distortion and AM to PM distortion. It is highly desirable that these distortion products be reduced in order to fully exploit the available output power range of the power amplifier 130.

In an embodiment of the present invention, the distortion of a power amplifier 130 can be reduced by suitably pre-distorting the input signal. The amount of pre-distortion added to the input signal is determined by the amplitude and phase distortion characteristics of the particular power amplifier 130. In essence, harmonics generated by the particular power amplifier 130 will be reduced by introducing customized pre-distortion into the input signal.

Figure 4:
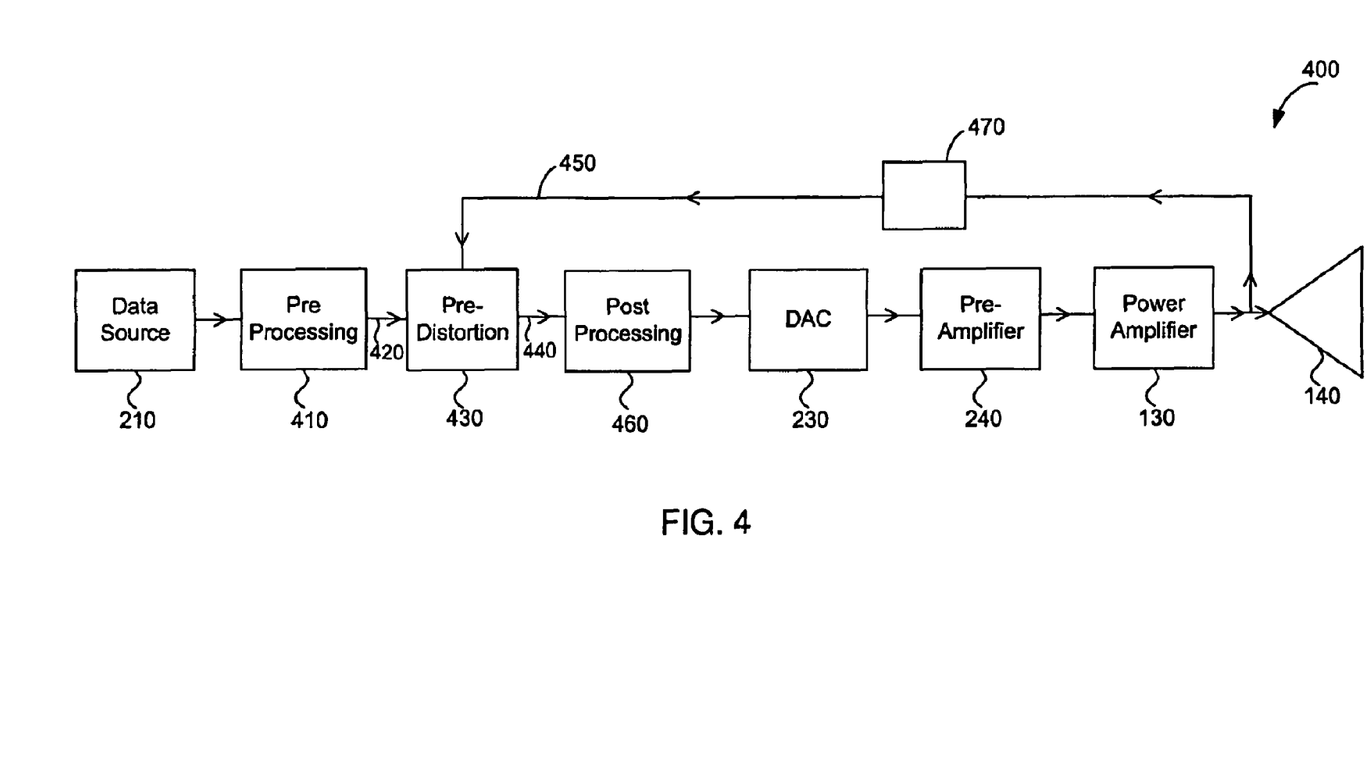
FIG. 4 is a block diagram of a transmitter with power amplifier pre-distortion capability, according to an exemplary embodiment of the present invention.

FIG. 4 illustrates a digital embodiment 400 of the present invention. In the embodiment 400, the data source 210 outputs a signal that is provided to a pre-processing module 410. In turn, the pre-processing module 410 outputs an uncorrected signal 420 that is fed into a pre-distortion module 430. Based on this input, the pre-distortion module 430 determines required amounts of added signal components, in both amplitude and phase, which would offset (i.e., be the inverse of) the internally generated distortion in the power amplifier 130.

These added signal components are then added to the uncorrected signal 420 to form a pre-distorted signal 440, which is then fed into a post-processing module 460. It should be noted that the functionality of the digital processing module 220, shown in FIG. 2, is split in FIG. 4 between the pre-processing module 410 and the post-processing module 460. As FIG. 4 shows, a sampled output signal 450 is also input to the pre-distortion module 430. This input to the pre-distortion module 430 is used for calibration purposes, as described below. Sampled output signal 450 is obtained by passing a portion of the power amplifier output signal through RF block 470. RF block 470 includes a RF-to-baseband conversion function, sampling, and an optional filtering function.

Figure 5:
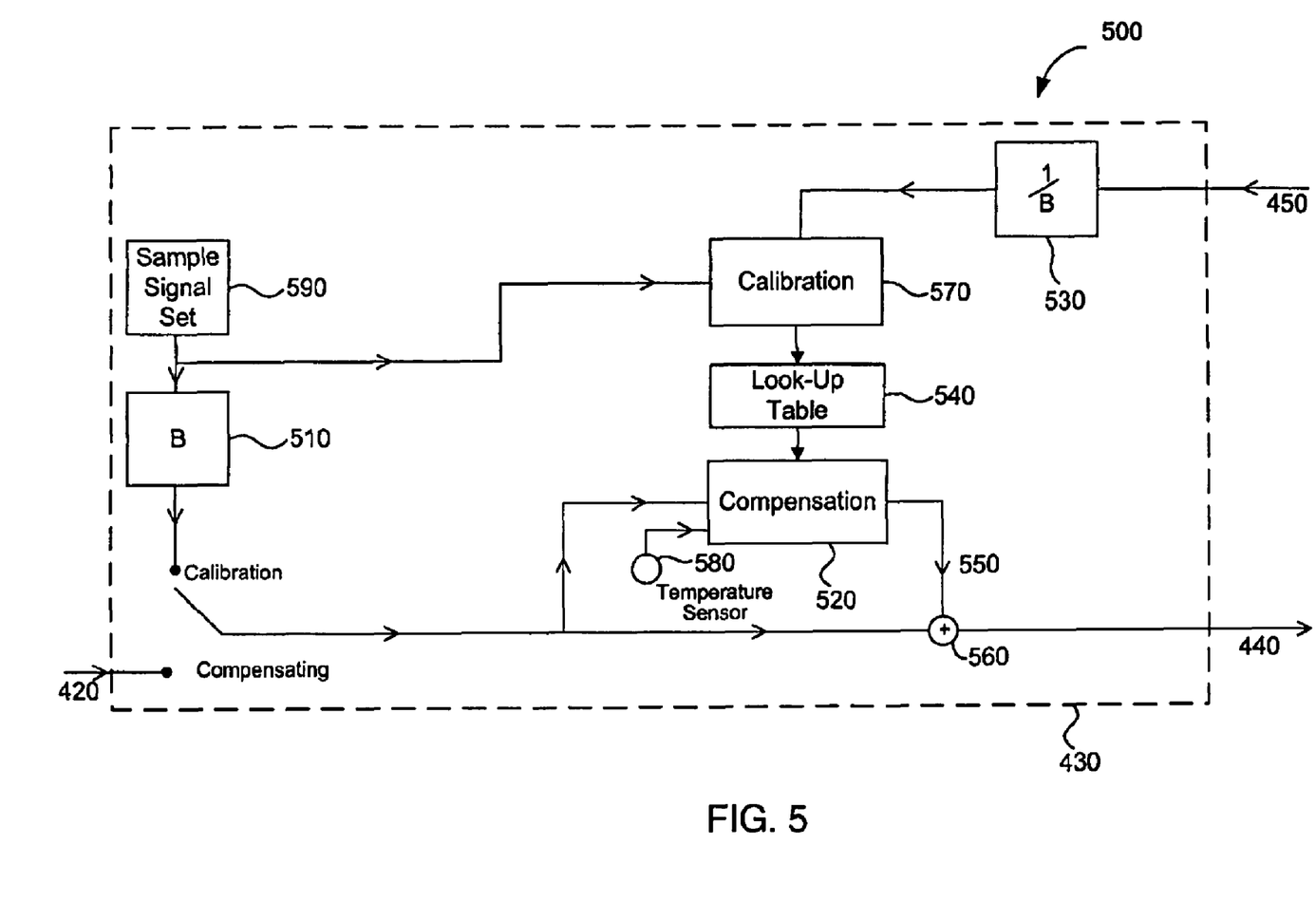
FIG. 5. is a block diagram that illustrates different components within the power amplifier pre-distortion module shown in FIG. 4.

FIG. 5 illustrates an exemplary embodiment 500 of the architecture of a pre-distortion module 430. While the pre-distortion module 430 is in its regular operating (or "compensating") state, the uncorrected signal 420 is received at an input to a compensation module 520. The compensation module 520 parameterizes the uncorrected signal 420. Based on the relationship between the uncorrected signal 420 and the power level of the power amplifier 130, the compensation module 520 determines the compensation appropriate to the operating state of the downstream power amplifier 130.

In one simple embodiment of the compensation module 520, the compensation module 520 generates a single index value that is representative of the instantaneous power level of the operating state of the downstream power amplifier 130. Based on the index value, the compensation module 520 identifies the appropriate location in a pre-populated look-up table 540 for the correction value. A pre-distortion correction signal 550 is generated based on the correction value in the look-up table 540. The pre-distortion correction signal 550 is then summed with the uncorrected signal 420 in a summer 560, to create a pre-distorted signal 440. Mathematically, this embodiment of the pre-distortion module 430 may be represented as follows:

Pre-distorted signal=C*uncorrected signal,
where C=correction factor;
C=1+ϵ; and
ϵ=pre-distortion correction coefficient.

As noted in the embodiment 500 described above, the index value (and the pre-distortion correction coefficient ϵ) is a surrogate for the instantaneous power level of the power amplifier 130. As such, there is a simple one-to-one relationship between the instantaneous power level and the value of the pre-distortion correction coefficient. As noted above, the look-up table 540 can be used to capture this one-to-one relationship over the power range of interest for the power amplifier 130.

In other embodiments of the current invention, a more complex relationship can exist between the distortion characteristics and the instantaneous output power of the power amplifier 130. Such is the case for a power amplifier 130 having "memory", wherein its distortion characteristics are more fully represented by a relationship between not only the current instantaneous power level but also the instantaneous power level at various times immediately preceding the time of interest. In such a case, the relevant functional relationship is a higher order relationship. In some situations, that higher order relationship is an average of the instantaneous power level at various times preceding the time of interest.

In the case of a higher order relationship, the compensation module 520 maintains a memory of prior index values associated with the various times immediately preceding the time of interest. The pre-distortion correction value 550 is thus determined based upon a formula that uses the values in the look-up table 540 corresponding to each of the index values in the time series. The formula so used mimics the higher order time-dependent relationship between the distortion characteristics and the operating state of the power amplifier 130.

Similarly, more complete representations of the distortion characteristics of a power amplifier can be obtained by capturing information regarding various non-power properties, e.g. frequency and temperature. In the case of a power amplifier 130 whose distortion characteristics depend on both instantaneous power level and frequency, a multi-dimensional look-up table 540 can be implemented. In this embodiment, the generator determines the frequency of the uncorrected signal 420 in addition to the index value for use in accessing the multi-dimensional look-up table 540. In a more simplified embodiment, the additional frequency dependence is resolved by recalibration at the other frequencies of interest.

Similarly, in the case of the power amplifier 130 whose distortion characteristics depend on both instantaneous power level and temperature, the multi-dimensional look-up table 540 can be implemented.

In FIG. 5, a temperature sensor 580 is shown, whose output is fed into the compensation module 520. Should the distortion-temperature relationship be a linear relationship, a suitable pre-distortion correction signal can be generated based on the two parameters that uniquely define the straight-line relationship. These two parameters would typically be stored in the compensation module 520.

In each of the above embodiments, the particular approach relies on a pre-populated look-up table 540, or its equivalent functional relationship, e.g. linear temperature relationship with the two parameters previously determined. In determining these pre-populated and/or pre-determined values, it should be noted that the relationship between the input power (or other independent variable such as temperature or frequency) and the distortion factor is unique to each power amplifier, similar to the power amplifier 130. Accordingly, for each power amplifier similar to the power amplifier 130, a calibration procedure is required in order to populate the pre-distortion module with the pre-distortion correction values unique to that particular power amplifier 130.

In the case where a simple one-to-one relationship exists between the distortion characteristics and output power level, the calibration process results in the generation of a simple look-up table 540. In such a process, the look-up table is populated in discrete intervals, beginning with the smallest input power level of interest. Continuing with FIG. 5, FIG. 5 also illustrates the different components involved in such a calibration, according to an exemplary embodiment of the present invention.

In FIG. 5, a sample signal set 590 may be used for calibration, though the scope of the present invention is not limited in this respect. In calibration mode, the sample signal set provides a series of input signal tones of various power levels, from which the resulting distortion at the output of the power amplifier may be measured, and from which the pre-distortion correction coefficient may be derived and stored in the look-up table 540. During calibration, the uncorrected signal 420 is disconnected while output from the sample signal set 590 is active. The sample signal set 590 is sent directly to the calibration module 570, and via a gain block 510 (with adjustable gain B) to the compensation module 520 and summer module 560. The purpose of the gain block 510 is to set the power level of the sample signal set 590 to the desired level. An attenuation block 530, with adjustable attenuation B, connects the sampled output signal 450 to the calibration module 570. The attenuation block 530 serves to reverse the effect of the gain block 510.

Figure 6:
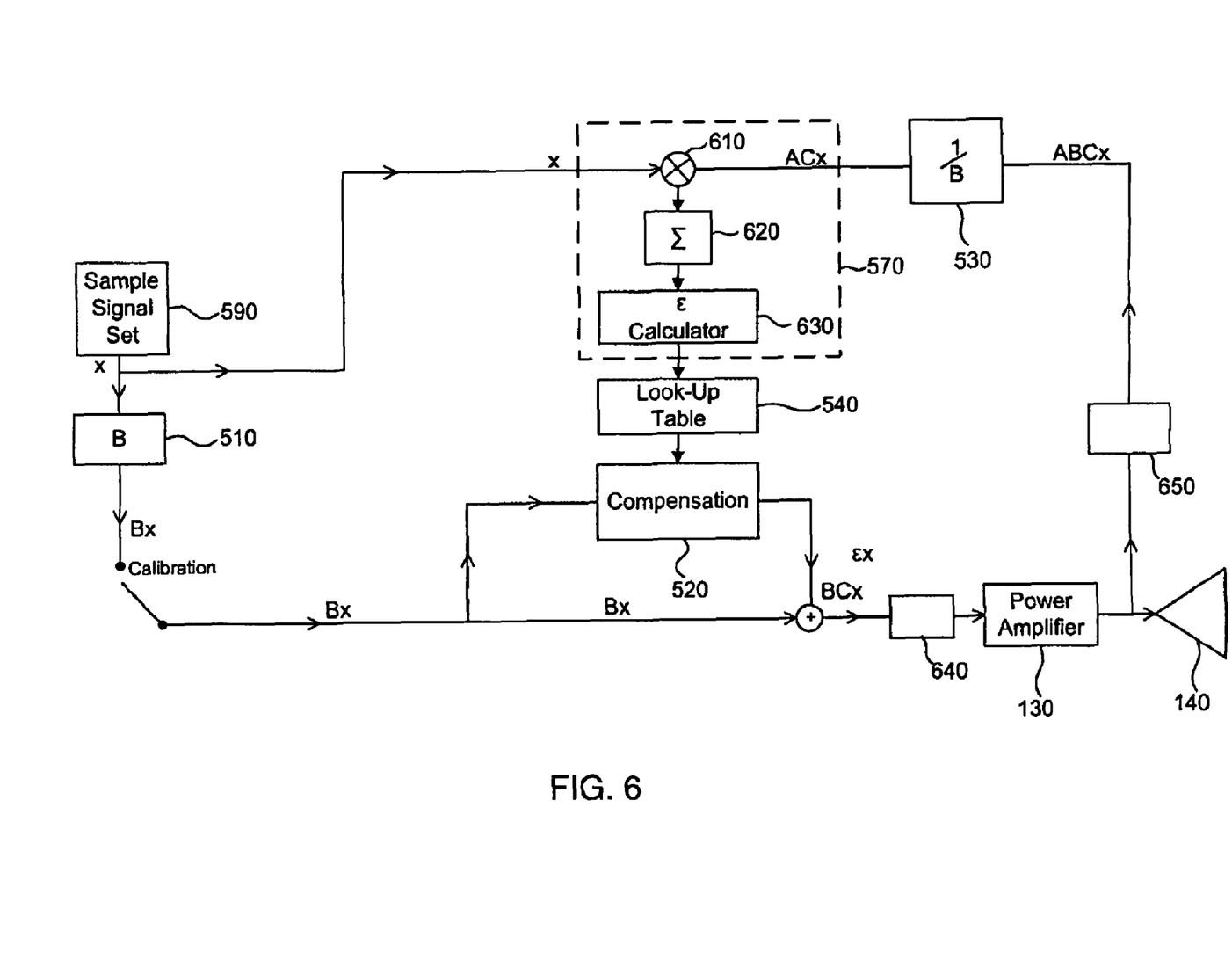
FIG. 6 is a block diagram that illustrates the different components along a power amplifier pre-distortion calibration path, according to an exemplary embodiment of the present invention.

FIG. 6 provides a simplified explanation of the calibration module 570 according to an exemplary embodiment of the present invention. The calibration module 570 contains a correlator 610, a summation unit 620, and an ϵ calculator 630. In one embodiment of the invention, tone samples '$x_i$' from the sample signal set 590 are fed directly to a correlator 610 and indirectly to the correlator via the cascaded combination of the pre-distortion module 430 and the power amplifier 130. As noted earlier, the pre-distortion module 430 applies a transformation C, which is equal to C=1+ϵ. In a similar manner to that described earlier in FIG. 4, RF blocks 640 and 650 provide baseband-to-RF and RF-to-baseband conversion functions respectively, sampling and an optional filtering function.

Similarly, the power amplifier 130 applies a transformation that will be denoted as A. Accordingly, an output Y of the correlator 610 and the summation unit 620 may be calculated, for example, by the equation, $Y=\Sigma(CA|x|^2)$. At low output signal levels, the power amplifier 130 is linear and, for purposes of this analysis, introduces no significant distortion. At these variables, the correlator output achieves its reference value, denoted by $Y_0$. As the output power of the power amplifier 130 increases, distortion is introduced into the output signal, and pre-distortion signals need to be introduced to offset the distortion. Accordingly, ϵ needs to be chosen by the ϵ calculator 630 so that a product, CA, at the power level of interest, equals the value of that product at the small signal reference point, $C_0A_0$. While C (and therefore ϵ) can be determined directly by the formula $C_0Y_0/Y$, such a formula involves complex division.

As an alternative, the value of ϵ (and therefore C) at each output power level of interest can be determined iteratively through the use of the following gradient descent based formula: $\epsilon_{new}=(Y_0Y^*-Y_0Y_0^*)\lambda+\epsilon_{old}$, where $Y_0^*$ is the complex conjugate of $Y_0$, and $\lambda$ is small. Here, the value of $\lambda$ should be small enough such that convergence is assured. Using this approach, the difficulties of a complex division are avoided and replaced by the time required for the iterative technique to converge. This technique is repeated at each of the discrete power levels of interest over the operating power range of the power amplifier. The increments in power level step size in the look-up table 540 can be programmable. For example, in an exemplary embodiment of the current invention, a scalar register can be used to implement a programmable step increments of the look-up table 540.

In the embodiment of a power amplifier for which a more complex relationship is appropriate to properly characterize the distortion performance of that power amplifier, a multi-dimensional calibration technique would be deployed to capture the relevant characteristics. For example, a power amplifier whose instantaneous distortion performance is best captured by a multi-dimensional relationship with frequency and power level, would be calibrated by introducing a series of test signals over different frequencies and different input power levels in order to provide sufficient characterization coverage of the individual power amplifier.

Similarly, for a power amplifier whose distortion performance bears a relationship to operating temperature, that relationship can also be captured. In one embodiment of the current invention, where the relationship between pre-distortion correction value and operating temperature is a linear relationship, a calibration procedure can be developed that captures the two parameter values necessary to describe that linear relationship.

Other embodiments may capture solutions to other calibration challenges. For example, calibration can be broken into a plurality of power ranges, wherein the transmission radio frequency (RF) gain is re-set between each of these calibration power ranges. The motivation for the plurality of power ranges is not to overdrive the DAC, which receives the output of the pre-distortion module 430, after passing through the post-processing module 460. In another embodiment of the invention, the power amplifier may be recalibrated when the temperature of the system changes. In another embodiment, the power amplifier may be recalibrated initially during startup. In yet another embodiment, the PA may be recalibrated periodically.

Various alternatives exist as to the strategy by which the power amplifier 130 may be calibrated. Clearly, the entire look-up table 540 can be computed in a single procedure by stepping throughout the entire operating power range of the power amplifier, and populating an entry into the look-up table 540 for each power level of interest. Computation of each entry requires the use of an iterative algorithm or its equivalent. Such computation can require a substantial amount of time, where this calibration time coming at the expense of actual operations time. For example, a calibration time of 10 milliseconds can represent a considerable opportunity cost in terms of lost communications time in an 802.11 communications system. Moreover, it should be noted that due to changing power amplifier performance characteristics, periodic re-calibrations are often required, rather than a single calibration event that is valid in perpetuity. Such additional calibration cycles further add to the challenge of the appropriate tradeoff between the time devoted to calibration versus the time required for actual operations.

In an evaluation of the tradeoff between calibration time and operations time, an alternative to completing the entire calibration (and when necessary re-calibration) in a single transaction includes breaking the calibration effort into a number of smaller calibration transactions that are spread over time, and thereby lessening the impact of the calibration at a particular instant in time. Another alternative reduces the frequency of re-calibrations for portions of the operating power range where the need for such re-calibrations is diminished, e.g., at lower operating power levels where the power amplifier characteristics rarely change over time. In each of these alternatives, a partial calibration procedure would be undertaken whereby the procedure would use a starting power level and an ending power level that represent a sub-range of the overall operating power level of the power amplifier.

Another strategy to minimize the time devoted to calibration is to reduce the time required to iteratively determine each entry in the look-up table 540. The default starting point for the iterative determination of an entry in the look-up table 540 is typically zero. However, any particular convergence time can be accelerated by using a smarter alternative to the starting point. For example, a smarter alternative can be a previously computed look-up table entry for the same power level, i.e. the starting point can be the look-up table entry obtained from a prior calibration for the same power level. Such a choice of starting point makes intuitive sense since power amplifier characteristics often do not change significantly over time. Another smarter starting point alternative is to use a starting point based on the look-up table entry for an adjacent power level to that currently undergoing calibration (or re-calibration). Again, such a starting point makes intuitive sense by virtue of the fact that the AM-AM and the AM-PM characteristics (e.g., see FIGS. 3A and 3B) are continuous functions versus power level and therefore nearby points should provide a superior starting point when using an iterative procedure. In summary, it should be noted that all of these alternatives of optimized calibration time may be pursued separately from each other, or may be pursued simultaneously with each other.

Figure 7:
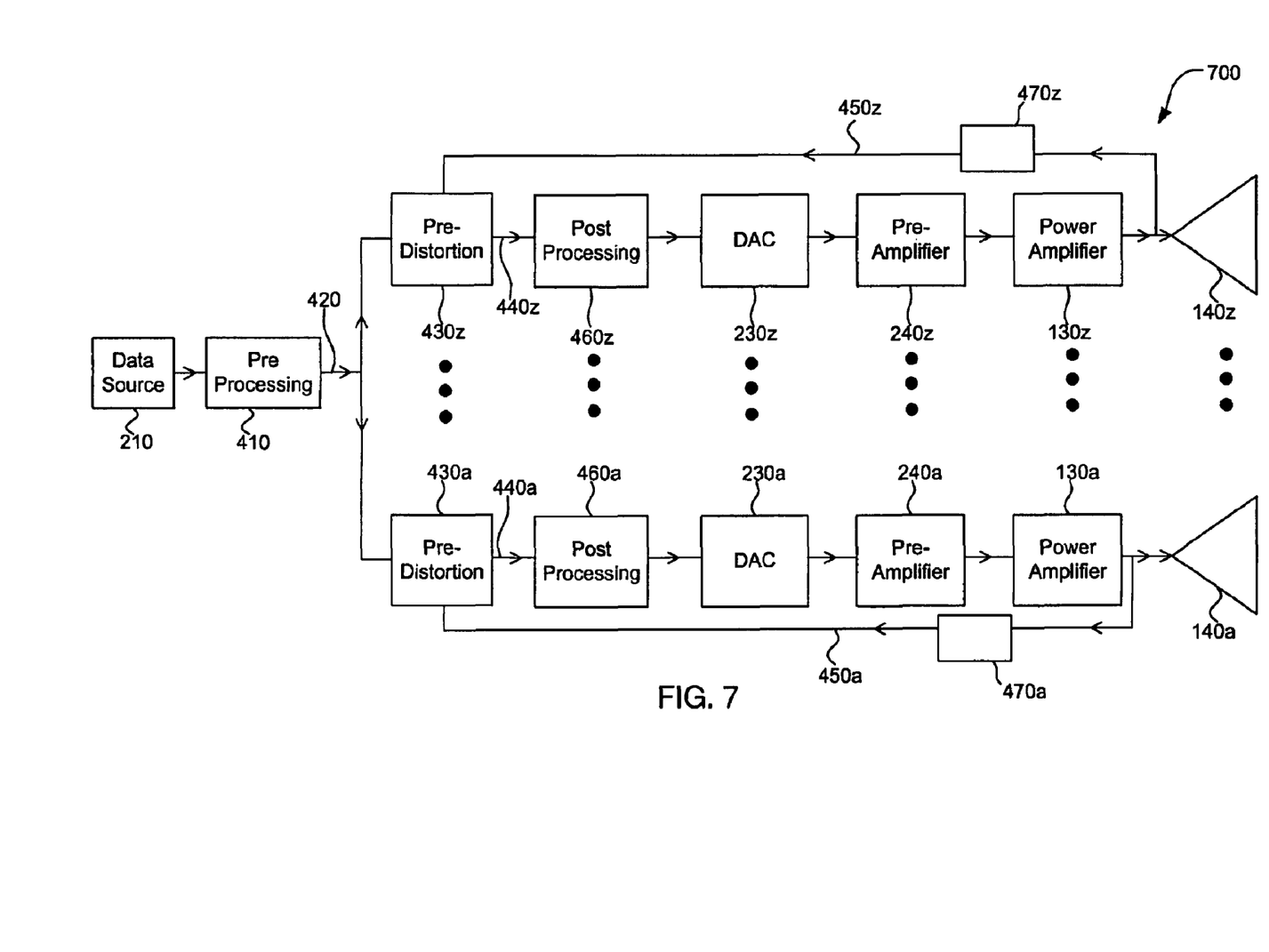
FIG. 7 illustrates a block diagram of a MIMO-based embodiment of the present invention.

The advent of MIMO systems has resulted in transmitter system architectures that feature a plurality of power amplifiers, one for each transmission signal. FIG. 7 illustrates a block diagram for such a MIMO-based embodiment of the current invention 700.

In this embodiment of the present invention for MIMO architectures, a pre-distortion module 430a through 430z is required for each power amplifier 130a through 130z. Within each pre-distortion module 430a through 430z is a calibration module for its respective power amplifier 430a through 430z. As above, the pre-distortion modules 430a through 430z operate in either a calibration mode or in a compensating mode. RF blocks 470a through 470z each include a RF-to-baseband conversion function, sampling, and an optional filtering function.

When the embodiment 700 is operating in a compensating mode, the data source 210 outputs a signal that is provided to a pre-processing module 410. In turn, the pre-processing module 410 outputs an uncorrected signal 420 that is fed into each of the pre-distortion modules 430a through 430z. Based on this input, each pre-distortion module 430a through 430z determines the required amounts of added signal components, in both amplitude and phase, which would offset (i.e., be the inverse of) the internally generated distortion in its respective power amplifier 130a through 130z.

These added signal components are then added to the uncorrected signal 420 to form a pre-distorted signal 440a through 440z, which is then fed into its respective post-processing module 460a through 460z. As before, the post-processing modules 460a through 460z are coupled to their respective DACs 230a through 230z, in turn coupled to their respective pre-amplifiers 240a through 240z, to their respective power amplifiers 130a through 130z, and finally to their respective antennas 140a through 140z.

When the embodiment 700 is operating in a calibration mode, for each power amplifier 130a through 130z, a sampled output signal 450a through 450z is input to its respective pre-distortion module 430a through 430z. Each sampled output signal 450a through 450z is obtained by passing a portion of the respective power amplifier output signal through respective RF block 470a through 470z. This input to each of the pre-distortion modules 430a through 430z is used for calibration purposes, as described earlier and below.

The calibration procedure for such a MIMO architecture can proceed under a number of alternative ways. In an exemplary embodiment, each power amplifier can be activated individually, while all other power amplifiers are shut off. For each active power amplifier, the resulting distortion is captured, and the appropriate correction value is entered into the pre-distortion module. Such an approach works best when the power amplifiers provide significant interference to each other.

Where the coupling between power amplifiers is minimal, all of the power amplifiers can be activated at once, and the resulting distortion at each output determined in the presence of all other power amplifiers being active. Based on the distortion so determined, the resulting correction value and relationship is captured.

As noted above, there is often a tradeoff between the time needed for calibration of the power amplifier and the time devoted to actual operations. Those same comments apply in the MIMO context, where various alternatives may be exploited to optimize the tradeoff. Such alternatives include breaking the calibration process into smaller calibration processes that focus on a subset of the operating power range of the power amplifier. Other alternatives focus instead on optimization of the iterative process of calibration at each individual power level. As above, these alternatives may be pursued separately from each other, or may be pursued simultaneously with each other.

According to an embodiment of the invention, the pre-distortion techniques described herein apply to implementations with on-chip power amplifiers, as well as implementations that also include one or more external power amplifiers in the transmitter. In implementations with more than one cascaded power amplifier, the pre-distortion technique seeks to reduce the total distortion at each operating point.

Figure 8:
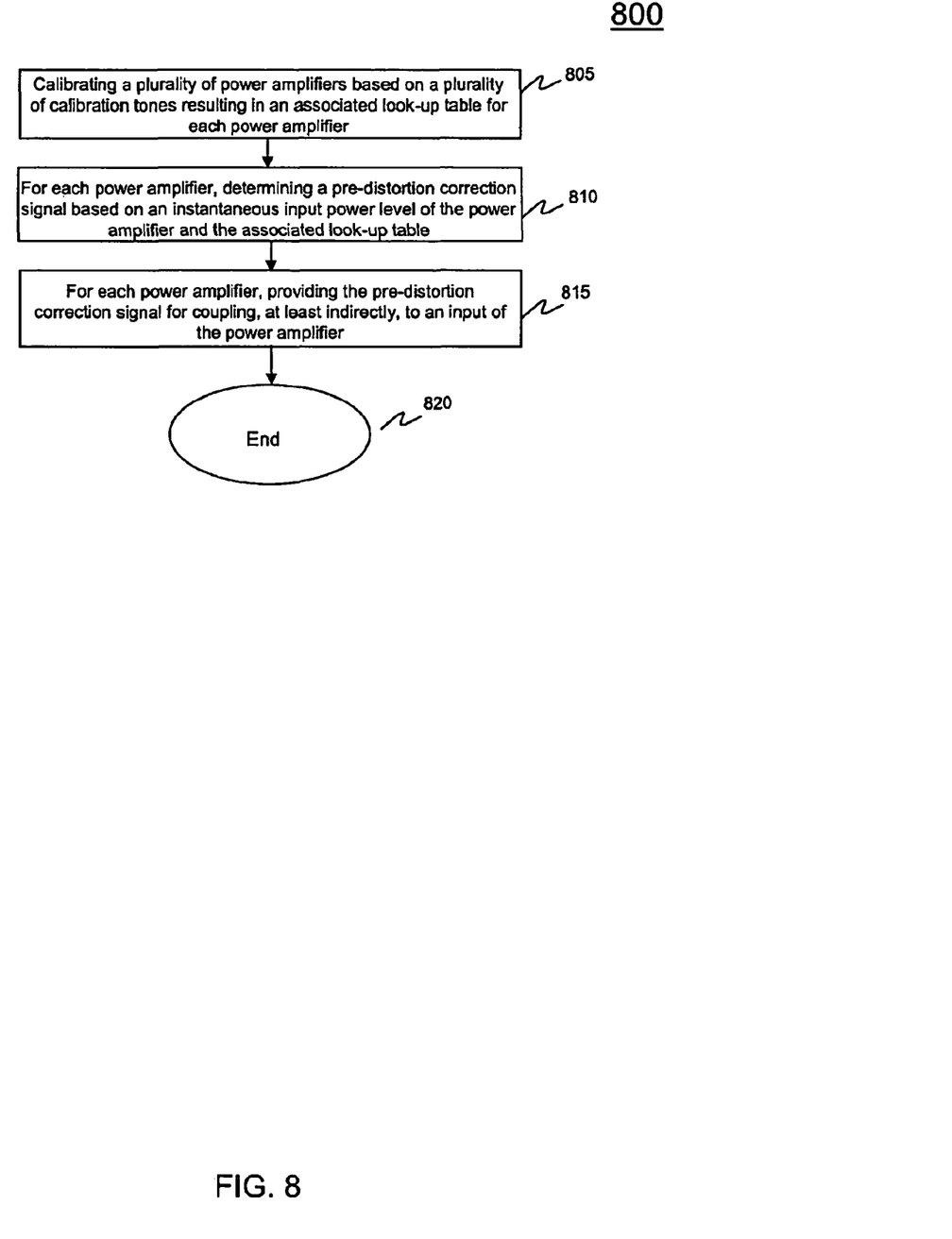
FIG. 8 is a flowchart diagram that illustrates a method for pre-distortion for a power amplifier, according to an embodiment of the present invention.

FIG. 8 illustrates a flowchart 800 that further describes the pre-distortion of power amplifiers in a MIMO system. In step 805, a plurality of power amplifiers are calibrated based on a plurality of calibration tones resulting in an associated look-up table for each power amplifier. In step 810, for each power amplifier, a pre-distortion correction signal is determined based on an instantaneous input power level of the power amplifier and the associated look-up table. In step 815, for each power amplifier, a pre-distortion correction signal is coupled, at least indirectly, to an input of each power amplifier.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An integrated power amplifier pre-distortion method comprising:
    calibrating an on-chip power amplifier based on a plurality of calibration tones resulting in a look-up table; and
    determining a pre-distortion correction signal based on an input power level of the on-chip power amplifier and the look-up table, the determining further comprising:
        measuring the input power level and at least one predecessor input power level of the on-chip power amplifier;
        generating index values in response to the measured input power level and the measured at least one predecessor input power level of the on-chip power amplifier; and
        generating a pre-distortion correction signal in response to the generated index values as applied to the look-up table based on the generated index values.

2. The integrated power amplifier pre-distortion method of claim 1, wherein the step of determining further comprises:
    receiving the operating temperature of the on-chip power amplifier; and
    generating a pre-distortion correction signal based, in part, on the received operating temperature.

3. An integrated power amplifier calibration method comprising:
    applying a calibration tone at a predetermined power level as an input signal to an on-chip power amplifier to provide an output signal from the on-chip power amplifier;
    determining a distortion component in the output signal of the on-chip power amplifier;
    estimating a pre-distortion coefficient based on the determined distortion component wherein the estimating a pre-distortion coefficient is performed iteratively using a starting point that corresponds to the estimated pre-distortion coefficient for the predetermined power level from a previous calibration; and
    storing an entry into a look-up table based on the estimated pre-distortion coefficient and the predetermined power level of the calibration tone.

4. The integrated power amplifier calibration method of claim 3, further comprising:

repeating the applying, the determining, the estimating, and the storing at a plurality of predetermined power levels associated with an operating power range of the on-chip power amplifier.

5. The integrated power amplifier calibration method of claim 3, further comprising:
repeating the applying, the determining, the estimating, and the storing at a plurality of predetermined power levels associated with a subset of an operating power range of the on-chip power amplifier.

6. The integrated power amplifier calibration method of claim 3, further comprising:
receiving an operating temperature of the on-chip power amplifier; and
storing an entry into a look-up table based on the estimated pre-distortion coefficient and the received operating temperature of the on-chip power amplifier.

7. An integrated power amplifier calibration method comprising:
applying a calibration tone at a predetermined power level as an input signal to an on-chip power amplifier to provide an output signal from the on-chip power amplifier;
determining a distortion component in the output signal of the on-chip power amplifier;
estimating a pre-distortion coefficient based on the determined distortion component wherein the estimating a pre-distortion coefficient is performed iteratively using a starting point that corresponds to the estimated pre-distortion coefficient for a power level adjacent to the predetermined power level; and
storing an entry into a look-up table based on the estimated pre-distortion coefficient and the predetermined power level of the calibration tone.

8. A power amplifier pre-distortion apparatus' comprising:
a look-up table including pre-distortion coefficients associated with input power levels for a power amplifier;
a generator module coupled to an input signal and the look-up table, and adapted to output a pre-distortion correction signal in response to the power level of the input signal, the generator module further comprising an indexing module coupled to the input signal, and adapted to provide an adjusted index value based on a plurality of index values determined in response to the power level and at least one predecessor power level of the input signal, said adjusted index value being used to locate an appropriate pre-distortion coefficient in the look-up table in order to determine the pre-distortion correction signal; and
a summation module coupled to the pre-distortion correction signal and coupled to the input signal, and adapted to sum the pre-distortion correction signal and the input signal to form an output signal.

9. The power amplifier pre-distortion apparatus of claim 8, wherein
the generator module further comprises:
a temperature look-up table including pre-distortion coefficients associated with operating temperatures of the power amplifier; and
the generator module modified to receive an operating temperature of the power amplifier, to be additionally coupled to the temperature look-up table, and to be adapted to output the pre-distortion correction signal to further include a responsiveness to the received operating temperature of the power amplifier.

10. A power amplifier pre-distortion apparatus for a MIMO application fed by a common input signal, comprising:
a plurality of look-up tables, each associated with a separate power amplifier, and each including pre-distortion coefficients associated with input power levels for its associated power amplifier;
for each look-up table, a generator module coupled to its associated look-up table and the common input signal, and adapted to output an associated pre-distortion correction signal in response to the power level of the common input signal, each of the generator modules further comprising an associated indexing module coupled to the common input signal, and adapted to provide an associated adjusted index value based on a plurality of associated index values determined in response to the power level and at least one predecessor power level of the common input signal, said associated adjusted index value being used to locate an associated appropriate pre-distortion coefficient in the associated look-up table in order to determine the associated pre-distortion correction signal; and
for each look-up table, a summation module coupled to the associated pre-distortion correction signal and coupled to the common input signal, and adapted to sum the associated pre-distortion correction signal and the common input signal to form an output signal.

11. The power amplifier pre-distortion apparatus for a MIMO application of claim 10, wherein each of the generator modules further comprises:
an associated temperature look-up table including associated pre-distortion coefficients associated with operating temperatures of the associated power amplifier; and
the generator module modified to receive an operating temperature of the associated power amplifier, to be additionally coupled to the associated temperature look-up table, and to be adapted to output the associated pre-distortion correction signal to further include a responsiveness to the received operating temperature of the associated power amplifier.

12. The integrated power amplifier pre-distortion method of claim 1, wherein the step of generating a pre-distortion correction signal includes generating a pre-distortion correction signal using an average of the generated index values.

13. The integrated power amplifier pre-distortion method of claim 1, wherein an input power level and at least one predecessor input power level are an instantaneous input power level and at least one predecessor instantaneous input power level respectively.

14. The integrated power amplifier calibration method of claim 3, wherein the estimating a pre-distortion coefficient based on the determined distortion component includes using a gradient descent method.

15. The integrated power amplifier calibration method of claim 7, wherein the estimating a pre-distortion coefficient based on the determined distortion component includes using a gradient descent method.

16. The power amplifier pre-distortion apparatus of claim 8, wherein the indexing module comprises being further adapted to provide the adjusted index value based on an average of the plurality of index values.

17. The power amplifier pre-distortion apparatus of claim 8, wherein the input power levels for the power amplifier are instantaneous input power levels.

18. The power amplifier pre-distortion apparatus of claim 8, wherein the power amplifier is an on-chip power amplifier.

19. The power amplifier pre-distortion apparatus for a MIMO application of claim 10, wherein the associated indexing module comprises being further adapted to provide the associated adjusted index value based on an average of the plurality of associated index values.

20. The power amplifier pre-distortion apparatus for a MIMO application of claim 10, wherein the input power levels for the associated power amplifier are instantaneous input power levels.

21. The power amplifier pre-distortion apparatus for a MIMO application of claim 10, wherein the associated power amplifiers are on-chip power amplifiers.

* * * * *

UNITED STATES PATENT AND TRADEMARK OFFICE
CERTIFICATE OF CORRECTION

| | | |
|---|---|---|
| PATENT NO. | : 8,294,516 B2 | Page 1 of 1 |
| APPLICATION NO. | : 12/139634 | |
| DATED | : October 23, 2012 | |
| INVENTOR(S) | : Young et al. | |

It is certified that error appears in the above-identified patent and that said Letters Patent is hereby corrected as shown below:

Column 2, line 59, replace "FIG. 1 or 2" with --FIGs. 1 or 2--.

Column 11, line 35, replace "apparatus' comprising:" with --apparatus comprising--.

Signed and Sealed this
First Day of January, 2013

David J. Kappos
*Director of the United States Patent and Trademark Office*